(12) United States Patent
Lei et al.

(10) Patent No.: US 8,883,614 B1
(45) Date of Patent: *Nov. 11, 2014

(54) WAFER DICING WITH WIDE KERF BY LASER SCRIBING AND PLASMA ETCHING HYBRID APPROACH

(71) Applicant: Applied Materials, Inc., Santa Clara, CA (US)

(72) Inventors: Wei-Sheng Lei, San Jose, CA (US); Brad Eaton, Menlo Park, CA (US); Apama Iyer, Sunnyvale, CA (US); Madhava Rao Yalamanchili, Morgan Hill, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/947,890

(22) Filed: Jul. 22, 2013

Related U.S. Application Data

(60) Provisional application No. 61/826,131, filed on May 22, 2013.

(51) Int. Cl.
*H01L 21/00* (2006.01)
*H01L 21/78* (2006.01)

(52) U.S. Cl.
CPC ..................................... *H01L 21/78* (2013.01)
USPC ............ 438/460; 438/462; 438/463; 438/464

(58) Field of Classification Search
USPC .................. 438/460, 462, 463, 464
See application file for complete search history.

(56) References Cited

U.S. PATENT DOCUMENTS

| | | |
|---|---|---|
| 4,049,944 A | 9/1977 | Garvin et al. |
| 5,593,606 A | 1/1997 | Owen et al. |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 Pages.

(Continued)

*Primary Examiner* — Nicholas Tobergte
(74) *Attorney, Agent, or Firm* — Blakely Sokoloff Taylor Zafman LLP

(57) ABSTRACT

Methods of dicing semiconductor wafers, each wafer having a plurality of integrated circuits, are described. In an example, approaches for wafer dicing with wide kerf by using a laser scribing and plasma etching hybrid approach are described. For example, a method of dicing a semiconductor wafer including a plurality of integrated circuits separated by dicing streets involves forming a mask above the semiconductor wafer, the mask having a layer covering and protecting the integrated circuits. The method also involves patterning the mask with a laser scribing process to provide a patterned mask having a pair of parallel gaps for each dicing street, exposing regions of the semiconductor wafer between the integrated circuits. Each gap of each pair of parallel gaps is separated by a distance. The method also involves etching the semiconductor wafer through the gaps in the patterned mask to singulate the integrated circuits.

18 Claims, 12 Drawing Sheets

(56) References Cited

U.S. PATENT DOCUMENTS

| | | | |
|---|---|---|---|
| 6,057,180 | A | 5/2000 | Sun et al. |
| 6,174,271 | B1 | 1/2001 | Kosmowski |
| 6,306,731 | B1 | 10/2001 | Igarashi et al. |
| 6,407,363 | B2 | 6/2002 | Dunsky et al. |
| 6,465,158 | B1 | 10/2002 | Sekiya |
| 6,528,864 | B1 | 3/2003 | Arai |
| 6,574,250 | B2 | 6/2003 | Sun et al. |
| 6,582,983 | B1 | 6/2003 | Runyon et al. |
| 6,593,542 | B2 | 7/2003 | Baird et al. |
| 6,642,127 | B2 | 11/2003 | Kumar et al. |
| 6,676,878 | B2 | 1/2004 | O'Brien et al. |
| 6,696,669 | B2 | 2/2004 | Hembree et al. |
| 6,706,998 | B2 | 3/2004 | Cutler |
| 6,759,275 | B1 | 7/2004 | Lee et al. |
| 6,803,247 | B2 | 10/2004 | Sekiya |
| 6,887,804 | B2 | 5/2005 | Sun et al. |
| 6,998,571 | B2 | 2/2006 | Sekiya et al. |
| 7,128,806 | B2 | 10/2006 | Nguyen et al. |
| 7,129,114 | B2 * | 10/2006 | Akram .................. 438/110 |
| 7,129,150 | B2 | 10/2006 | Kawai |
| 7,179,723 | B2 | 2/2007 | Genda et al. |
| 7,265,033 | B2 | 9/2007 | Shigematsu et al. |
| 7,364,986 | B2 | 4/2008 | Nagai et al. |
| 7,435,607 | B2 | 10/2008 | Nagai |
| 7,459,377 | B2 | 12/2008 | Ueda et al. |
| 7,468,309 | B2 | 12/2008 | Shigematsu et al. |
| 7,473,866 | B2 | 1/2009 | Morishige et al. |
| 7,507,639 | B2 | 3/2009 | Nakamura |
| 7,508,052 | B2 * | 3/2009 | Burke et al. ................ 257/620 |
| 7,622,365 | B2 * | 11/2009 | Parekh .................. 438/462 |
| 7,629,228 | B2 | 12/2009 | Haji et al. |
| 7,678,670 | B2 | 3/2010 | Arita et al. |
| 7,687,740 | B2 | 3/2010 | Bruland et al. |
| 7,754,584 | B2 | 7/2010 | Kumakawa |
| 7,767,551 | B2 | 8/2010 | Arita et al. |
| 7,767,554 | B2 | 8/2010 | Arita et al. |
| 7,776,720 | B2 | 8/2010 | Boyle et al. |
| 7,838,323 | B2 | 11/2010 | Utsumi et al. |
| 7,859,084 | B2 | 12/2010 | Utsumi et al. |
| 7,875,898 | B2 | 1/2011 | Maeda |
| 7,906,410 | B2 | 3/2011 | Arita et al. |
| 7,923,351 | B2 | 4/2011 | Arita |
| 7,927,973 | B2 | 4/2011 | Haji et al. |
| 7,986,039 | B2 * | 7/2011 | McAvoy et al. ............. 257/709 |
| 8,507,363 | B2 * | 8/2013 | Lei et al. ................. 438/462 |
| 2003/0162313 | A1 | 8/2003 | Kim et al. |
| 2004/0080045 | A1 | 4/2004 | Kimura et al. |
| 2004/0137700 | A1 | 7/2004 | Sekiya |
| 2006/0043535 | A1 | 3/2006 | Hiatt |
| 2006/0205182 | A1 | 9/2006 | Soejima |
| 2009/0197394 | A1 * | 8/2009 | Parekh ................. 438/462 |
| 2009/0255911 | A1 | 10/2009 | Krishnaswami et al. |
| 2010/0129984 | A1 * | 5/2010 | Vakanas et al. ............. 438/463 |
| 2011/0312157 | A1 | 12/2011 | Lei et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

* cited by examiner $$I = \frac{E_p}{\pi \cdot w_0^2 \cdot \tau}$$

where $I$ is Intensity, $E_p$ is Pulse Energy, $w_0$ is Beam Radius, and $\tau$ is Pulse Width.

NARROW KERF

WIDE KERF

WAFER DICING WITH WIDE KERF BY LASER SCRIBING AND PLASMA ETCHING HYBRID APPROACH

CROSS-REFERENCE TO RELATED APPLICATIONS

This application claims the benefit of U.S. Provisional Application No. 61/826,131, filed May 22, 2013, the entire contents of which are hereby incorporated by reference herein.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention pertain to the field of semiconductor processing and, in particular, to methods of dicing semiconductor wafers, each wafer having a plurality of integrated circuits thereon.

In an embodiment, a method of dicing a semiconductor wafer including a plurality of integrated circuits separated by dicing streets involves forming a mask above the semiconductor wafer, the mask having a layer covering and protecting the integrated circuits. The method also involves patterning the mask with a laser scribing process to provide a patterned mask having a pair of parallel gaps for each dicing street, exposing regions of the semiconductor wafer between the integrated circuits. Each gap of each pair of parallel gaps is separated by a distance. The method also involves etching the semiconductor wafer through the gaps in the patterned mask to singulate the integrated circuits.

In an embodiment, an apparatus includes a plurality of singulated integrated circuits disposed on a dicing tape. The apparatus also includes one or more portions of a semiconductor wafer disposed on the dicing tape, among the singulated integrated circuits, and corresponding to dicing streets of the semiconductor wafer.

In an embodiment, a method of dicing a silicon substrate including a plurality of integrated circuits separated by dicing streets involves forming a mask above the silicon substrate, the mask including a layer covering and protecting the integrated circuits. The integrated circuits include a layer of silicon dioxide disposed above a layer of low K material and a layer of copper. The method also involves patterning the mask with a laser scribing process to provide a patterned mask having a pair of parallel gaps for each dicing street, exposing regions of the silicon substrate between the integrated circuits. Each gap of each pair of parallel gaps is separated by a distance. The method also involves etching the silicon substrate through the gaps in the patterned mask to singulate the integrated circuits. Etching the silicon substrate through the gaps in the patterned mask to singulate the integrated circuits involves retaining portions of the silicon substrate between each gap of each pair of parallel gaps.

DETAILED DESCRIPTION

Figure 1:
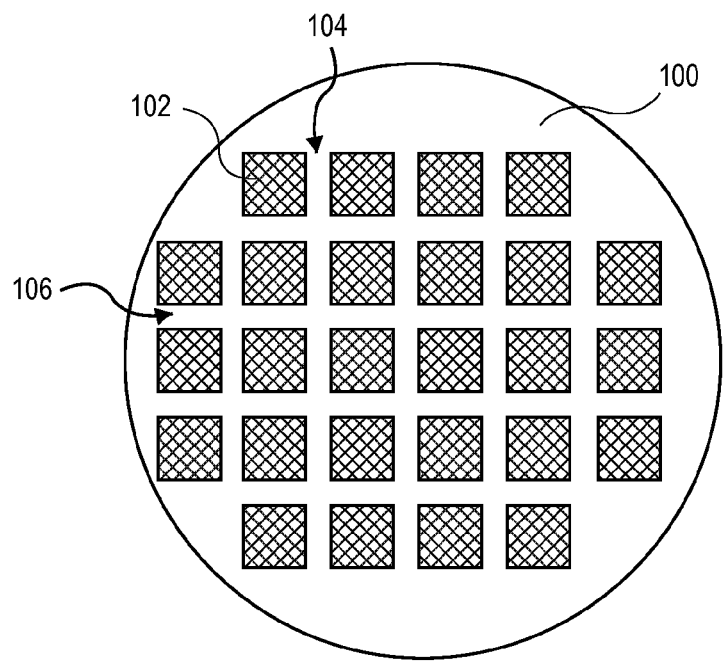
FIG. 1 illustrates a top plan of a semiconductor wafer to be diced, in accordance with an embodiment of the present invention.

Methods of dicing semiconductor wafers, each wafer having a plurality of integrated circuits thereon, are described. In the following description, numerous specific details are set forth, such as laser scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing.

Generally, one or more embodiments are directed to approaches for wafer dicing with wide kerf by using a laser scribing and plasma etching hybrid approach. Thus, generally, embodiments may be directed to a method for laser scribing and plasma etching to obtain wide kerf to address, e.g., a need for wider streets between separated dies.

More specifically, during a laser scribing process, the laser beam removes the mask layer, the passivation layer, and device layers and expose silicon substrate for subsequent plasma etching. A narrow kerf such as 10-15 microns may be preferred for laser scribing throughput purposes. However, there may be implementations requiring a wide kerf such as 50-85 microns wide kerf. Due to limited availability of laser power, it may not be possible to use a laser beam with a large focus spot for scribing a single pass in order to obtain such a wide kerf. Instead, typically, a smaller laser spot is used to scribe several times in parallel in order to achieve to a wide opening. Such an approach, however, may not provide for an acceptable throughput.

To provide context, conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick bulk silicon singulation, the conventional approaches have yielded only poor process quality. Some of the challenges that may be faced when singulating die from thin wafers or substrates may include microcrack formation or delamination between different layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of laser scribing and plasma etching is used to dice a semiconductor wafer into individualized or singulated integrated circuits. In one embodiment, a femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment.

Figure 2:
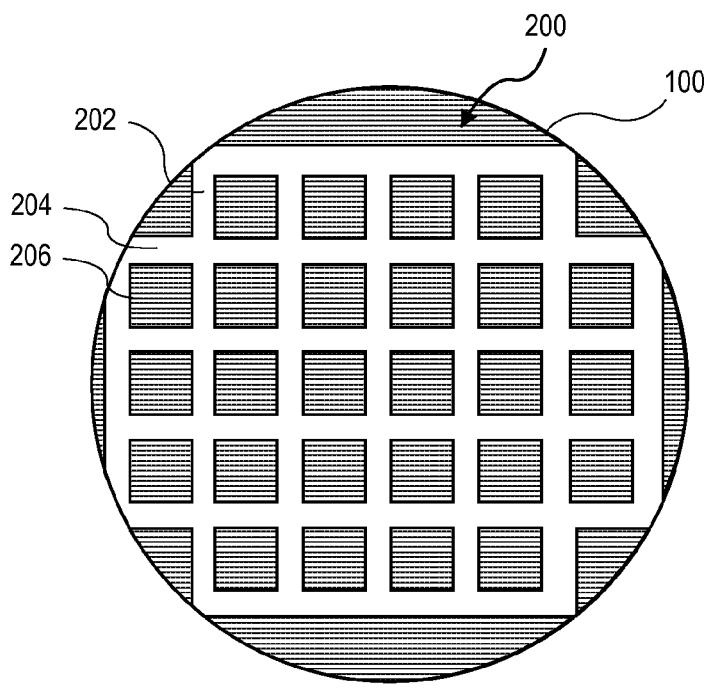
FIG. 2 illustrates a top plan of a semiconductor wafer to be diced that has a dicing mask formed thereon, in accordance with an embodiment of the present invention.

Thus, in an aspect of the present invention, a combination of laser scribing and plasma etching may be used to dice a semiconductor wafer into singulated integrated circuits. FIG. 1 illustrates a top plan of a semiconductor wafer to be diced, in accordance with an embodiment of the present invention. FIG. 2 illustrates a top plan of a semiconductor wafer to be diced that has a dicing mask formed thereon, in accordance with an embodiment of the present invention.

Referring to FIG. 1, a semiconductor wafer 100 has a plurality of regions 102 that include integrated circuits. The regions 102 are separated by vertical streets 104 and horizontal streets 106. The streets 104 and 106 are areas of semiconductor wafer that do not contain integrated circuits and are designed as locations along which the wafer will be diced. Some embodiments of the present invention involve the use of a combination femtosecond-based laser scribe and plasma etch technique to cut trenches through the semiconductor wafer along the streets such that the dice are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 2, the semiconductor wafer 100 has a mask 200 deposited upon the semiconductor wafer 100. In one embodiment, the mask is deposited in a conventional manner to achieve an approximately 4-10 micron thick layer. The mask 200 and a portion of the semiconductor wafer 100 are patterned with a laser scribing process to define the locations (e.g., gaps 202 and 204) along the streets 104 and 106 where the semiconductor wafer 100 will be diced. The integrated circuit regions of the semiconductor wafer 100 are covered and protected by the mask 200. The regions 206 of the mask 200 are positioned such that during a subsequent etching process, the integrated circuits are not degraded by the etch process. Horizontal gaps 204 and vertical gaps 202 are formed between the regions 206 to define the areas that will be etched during the etching process to finally dice the semiconductor wafer 100.

Figure 3A:
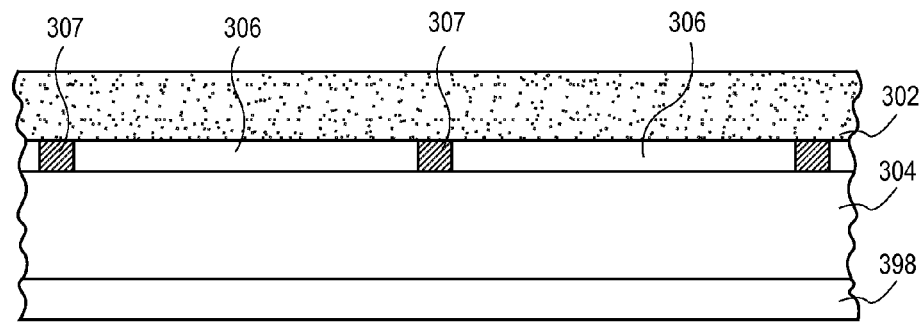
FIG. 3A illustrates a cross-sectional view of a semiconductor wafer including a plurality of integrated circuits during performing of a method of dicing the semiconductor wafer, in accordance with an embodiment of the present invention.
Figure 3B:
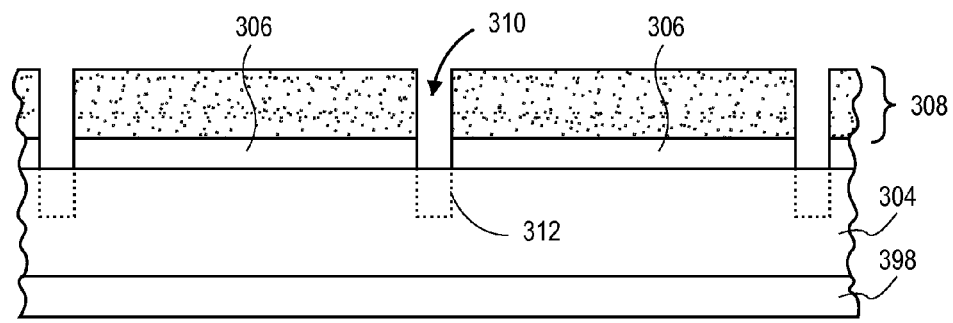
FIG. 3B illustrates a cross-sectional view of a semiconductor wafer including a plurality of integrated circuits during performing of a method of dicing the semiconductor wafer, in accordance with an embodiment of the present invention.
Figure 3C:
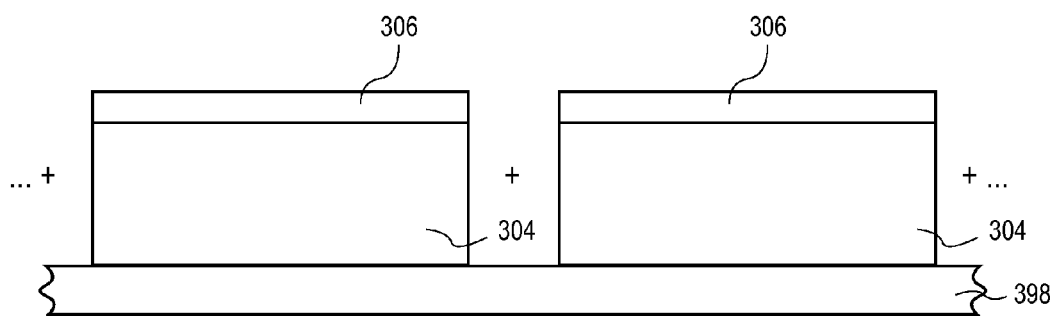
FIG. 3C illustrates a cross-sectional view of a semiconductor wafer including a plurality of integrated circuits during performing of a method of dicing the semiconductor wafer, in accordance with an embodiment of the present invention.
Figure 4A:
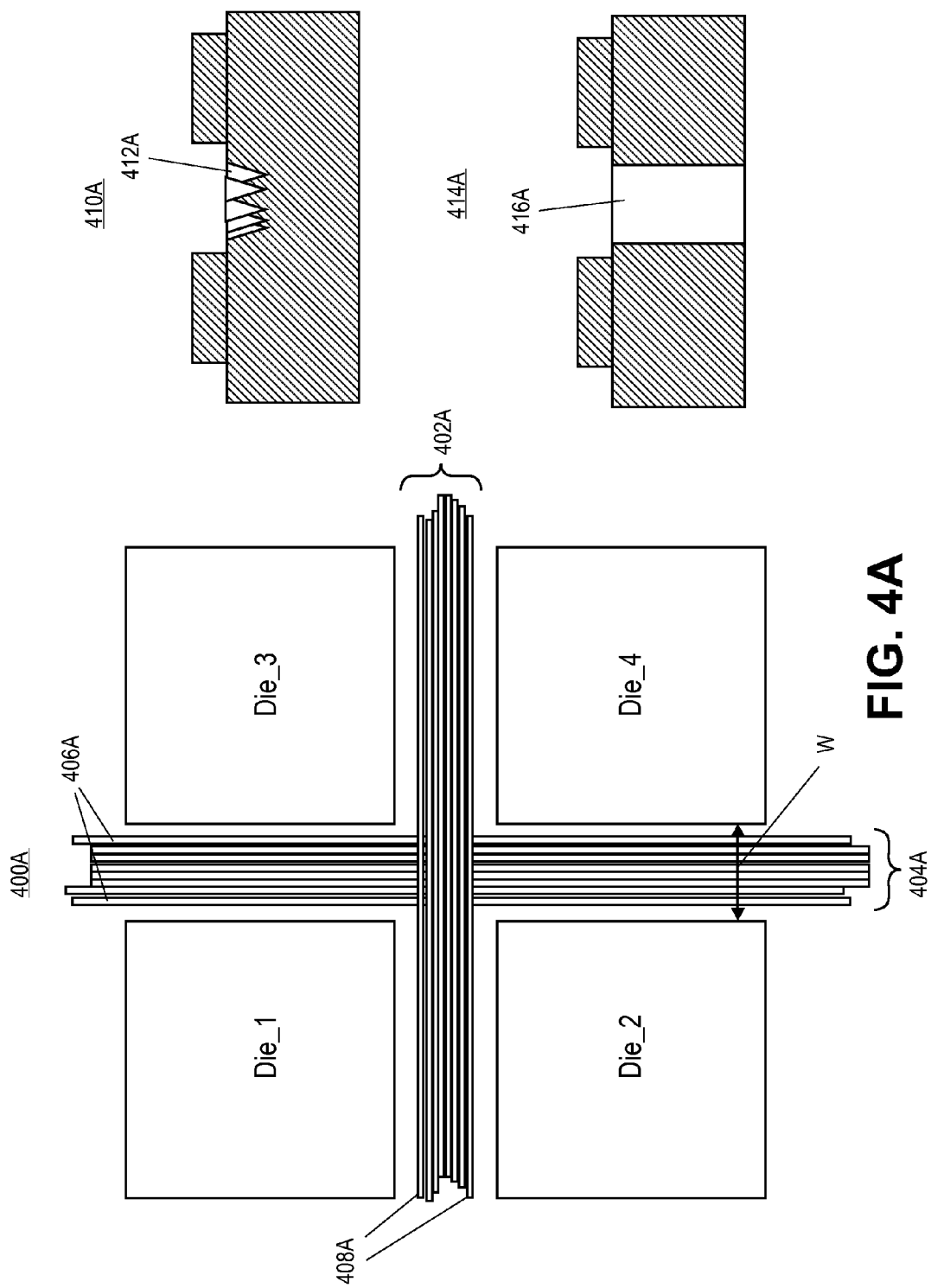
FIG. 4A illustrates a conventional laser scribing approach for wide kerf generation.
Figure 4B:
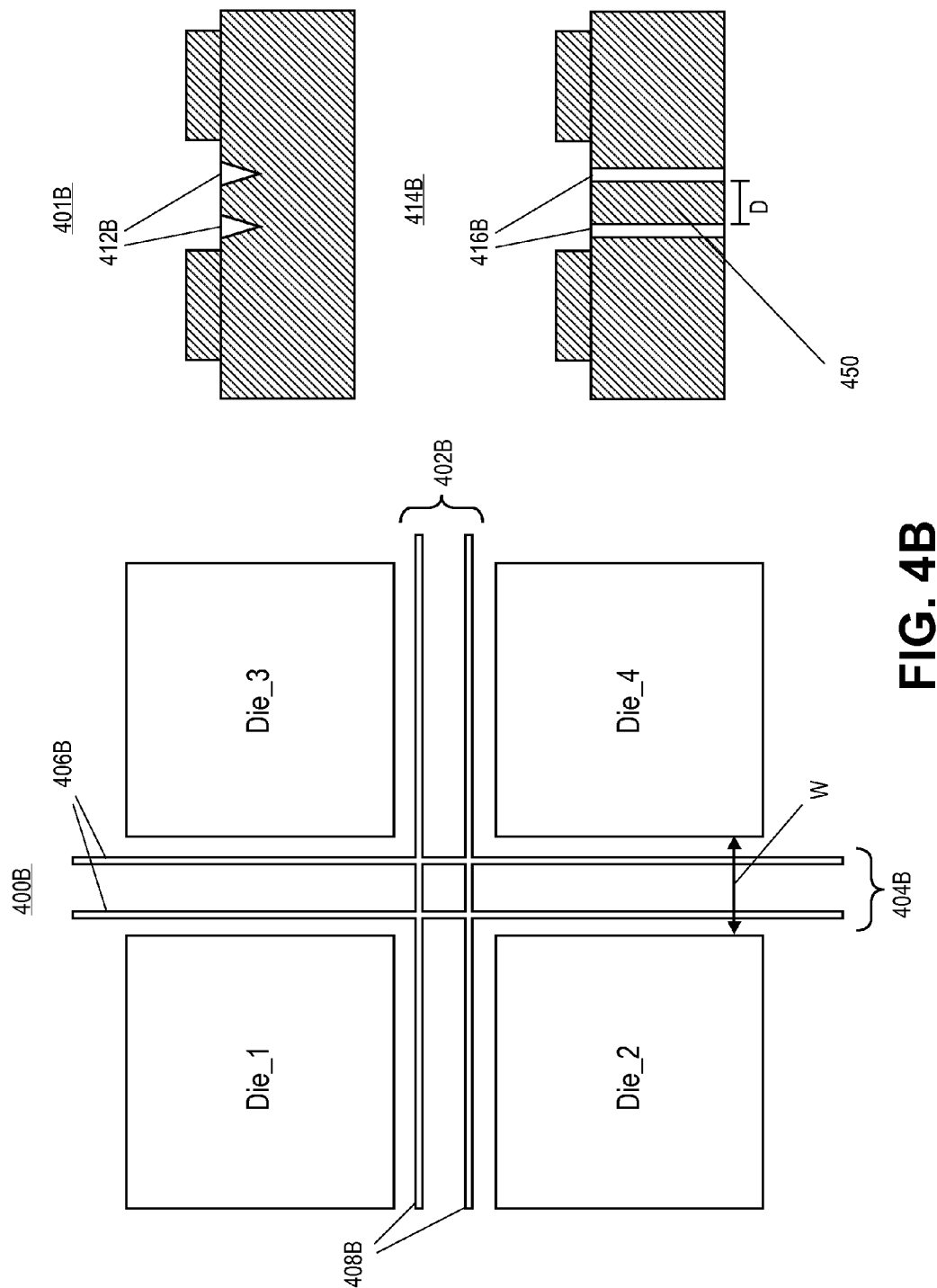
FIG. 4B illustrates a laser scribing approach for wide kerf generation involving scribing of parallel gaps separated by a distance, in accordance with an embodiment of the present invention.

FIGS. 3A-3C illustrate cross-sectional views of a semiconductor wafer including a plurality of integrated circuits during performing of a method of dicing the semiconductor wafer, in accordance with an embodiment of the present invention. FIGS. 3A-3C are provided to illustrate a general context for embodiments of the present invention. FIGS. 4A and 4B illustrate a more specific aspect of one or more embodiments of the present invention.

Referring to FIG. 3A, a mask 302 is formed above a semiconductor wafer or substrate 304. The mask 302 is composed of a layer covering and protecting integrated circuits 306 formed on the surface of semiconductor wafer 304. The mask 302 also covers intervening streets 307 formed between each of the integrated circuits 306.

Referring to FIG. 3B, the mask 402 is patterned with a laser scribing process to provide a patterned mask 308 with gaps 310, exposing regions of the semiconductor wafer or substrate 304 between the integrated circuits 306. As such, the laser scribing process is used to remove the material of the streets 307 originally formed between the integrated circuits 306. In accordance with an embodiment of the present invention, patterning the mask 302 with the laser scribing process includes forming trenches 312 partially into the regions of the semiconductor wafer 304 between the integrated circuits 306, as depicted in FIG. 3B.

Referring to FIG. 3C, the semiconductor wafer 304 is etched through the gaps 310 in the patterned mask 308 to singulate the integrated circuits 306. In accordance with an embodiment of the present invention, etching the semiconductor wafer 304 includes etching the trenches 312 formed with the laser scribing process to ultimately etch entirely through semiconductor wafer 304, as depicted in FIG. 3C.

FIGS. 3A-3C illustrates very generally a laser scribing and plasma dicing hybrid approach. More particularly, for wide street dicing, many laser scribes may need to be performed within a given street in order to obtain a targeted cumulative kerf. As an example, FIG. 4A illustrates a conventional laser scribing approach for wide kerf generation. Referring to the left-hand portion of FIG. 4A, a plurality of dies 400A (die 1-4) are separated by streets 402A and 404A, each having a die street width W. The width W is much wider than a workable spot size for a laser scribing process. As such, numerous gaps are scribed (laser scribe lines 406A and 408A) for each street to achieve a suitable scribe width. Referring to the right-hand portion of FIG. 4A, the top cross-sectional view 410A is shown post scribing to form a plurality of laser scribe lines 412A. The bottom cross-sectional view 414A is shown post subsequent plasma etching to form etched trench 416A.

By contrast, FIG. 4B illustrates a laser scribing approach for wide kerf generation involving scribing of parallel gaps separated by a distance, in accordance with an embodiment of the present invention. Referring to the left-hand portion of FIG. 4B, a plurality of dies 400B (die 1-4) are separated by streets 402B and 404B, each having a die street width W. The width W is much wider than a workable spot size for a laser scribing process. In contrast to FIG. 4A, and in accordance with an embodiment of the present invention, a pair of parallel gaps (pair 406B and pair 408B) is scribed for each dicing street. Referring to the right-hand portion of FIG. 4B, the top cross-sectional view 410B is shown post scribing, revealing the pair of scribed parallel gaps 412B. The bottom cross-sectional view 414B is shown post subsequent plasma etching to form a pair 416B of etched trenches. Since the parallel gaps of the pair 416B are separated by a distance (D), remaining material 450 may be present following the plasma etch. It is to be understood that, upon dicing, such remaining material is separated from the singulated dies. As such, in one embodiment, the remaining material can be retrieved from, e.g., dicing tape post die-pick.

Thus, in an embodiment, a smaller laser focus spot (e.g., 10 um) is to scribe two separated lines in parallel either sequentially or two split beams are used simultaneously. The separation distance of the two scribed lines should yield the required final kerf width. Post laser scribing, the wafer is etched through these two scribed lines. In one such embodiment, each gap of each pair of parallel gaps is formed at the same time using a split laser beam. In another embodiment, each gap of each pair of parallel gaps is formed at the same time using a two laser beams. In another embodiment, each gap of each pair of parallel gaps is formed sequentially. In any case, the overall approach provides for wide kerf generation.

In an embodiment, a narrow kerf such as 10-15 microns may be preferred for laser scribing throughput purposes. However, there may be implementations requiring a wide kerf such as 50-85 microns wide kerf. Thus, in one embodiment, a total width of the distance plus the width of each gap of each pair of parallel gaps is approximately in the range of 50-85 microns. In one embodiment, the width of each gap of each pair of parallel gaps is approximately in the range of 10-15 microns.

In an embodiment, during a die-pick process, an underlying dicing tape is expanded and dies are picked. The portion between the two separated etched trenched will remain on the dicing tape which can be either collected or disposed. In the end, the wide kerf requirement is satisfied. The above described approach can have the significant throughput advantage over conventional approaches.

In accordance with an embodiment of the present invention, referring again to FIGS. 3A-3C, forming the mask 302 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate. In other embodiments, non-photosensitive masking layers are used as mask 302, e.g., polymeric layers that may be deposited or spun-on and are not necessarily amenable to photolithographic patterning. In some embodiments, mask 302 includes a water-soluble material layer.

In an embodiment, semiconductor wafer or substrate 304 is composed of a material suitable to withstand a fabrication process and upon which semiconductor processing layers may suitably be disposed. For example, in one embodiment, semiconductor wafer or substrate 304 is composed of a group IV-based material such as, but not limited to, crystalline silicon, germanium or silicon/germanium. In a specific embodiment, providing semiconductor wafer 304 includes providing a monocrystalline silicon substrate. In a particular embodiment, the monocrystalline silicon substrate is doped with impurity atoms. In another embodiment, semiconductor wafer or substrate 304 is composed of a III-V material such as, e.g., a III-V material substrate used in the fabrication of light emitting diodes (LEDs).

In an embodiment, semiconductor wafer or substrate 304 has disposed thereon or therein, as a portion of the integrated circuits 306, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 306. Materials making up the streets 307 may be similar to or the same as those materials used to form the integrated circuits 306. For example, streets 307 may be composed of layers of dielectric materials, semiconductor materials, and metallization. In one embodiment, one or more of the streets 307 includes test devices similar to the actual devices of the integrated circuits 306.

In an embodiment, patterning the mask 306 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 302, the streets 307 and, possibly, a portion of the semiconductor wafer or substrate 304.

Figure 5:
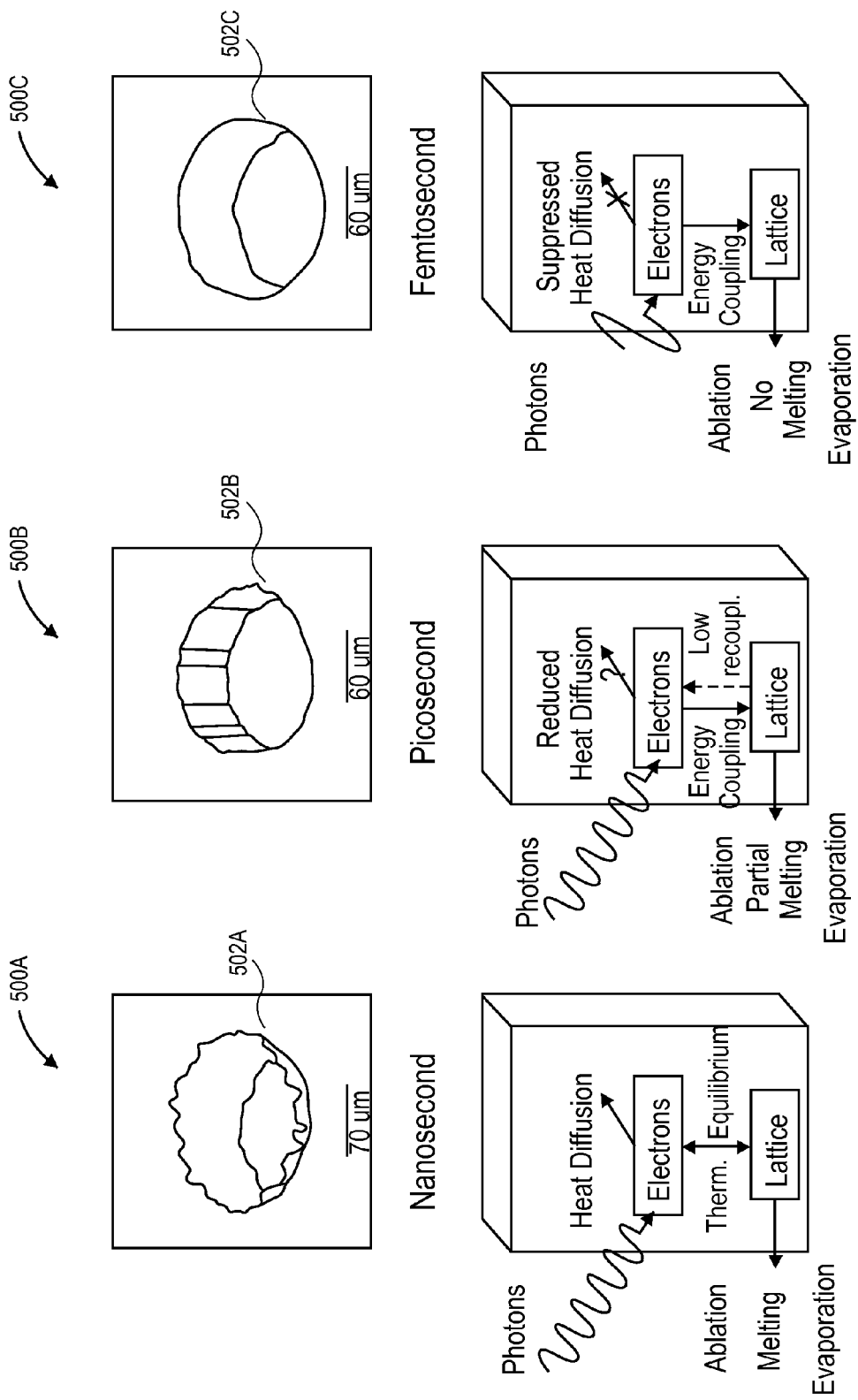
FIG. 5 illustrates the effects of using a laser pulse in the femtosecond range versus longer pulse times, in accordance with an embodiment of the present invention.

FIG. 5 illustrates the effects of using a laser pulse in the femtosecond range versus longer frequencies, in accordance with an embodiment of the present invention. Referring to FIG. 5, by using a laser with a pulse width in the femtosecond range heat damage issues are mitigated or eliminated (e.g., minimal to no damage 502C with femtosecond processing of a via 500C) versus longer pulse widths (e.g., damage 502B with picosecond processing of a via 500B and significant damage 502A with nanosecond processing of a via 500A). The elimination or mitigation of damage during formation of via 500C may be due to a lack of low energy recoupling (as is seen for picosecond-based laser ablation) or thermal equilibrium (as is seen for nanosecond-based laser ablation), as depicted in FIG. 5.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 6 illustrates a cross-sectional view of a stack of materials that may be used in a street region of a semiconductor wafer or substrate, in accordance with an embodiment of the present invention.

Figure 6:
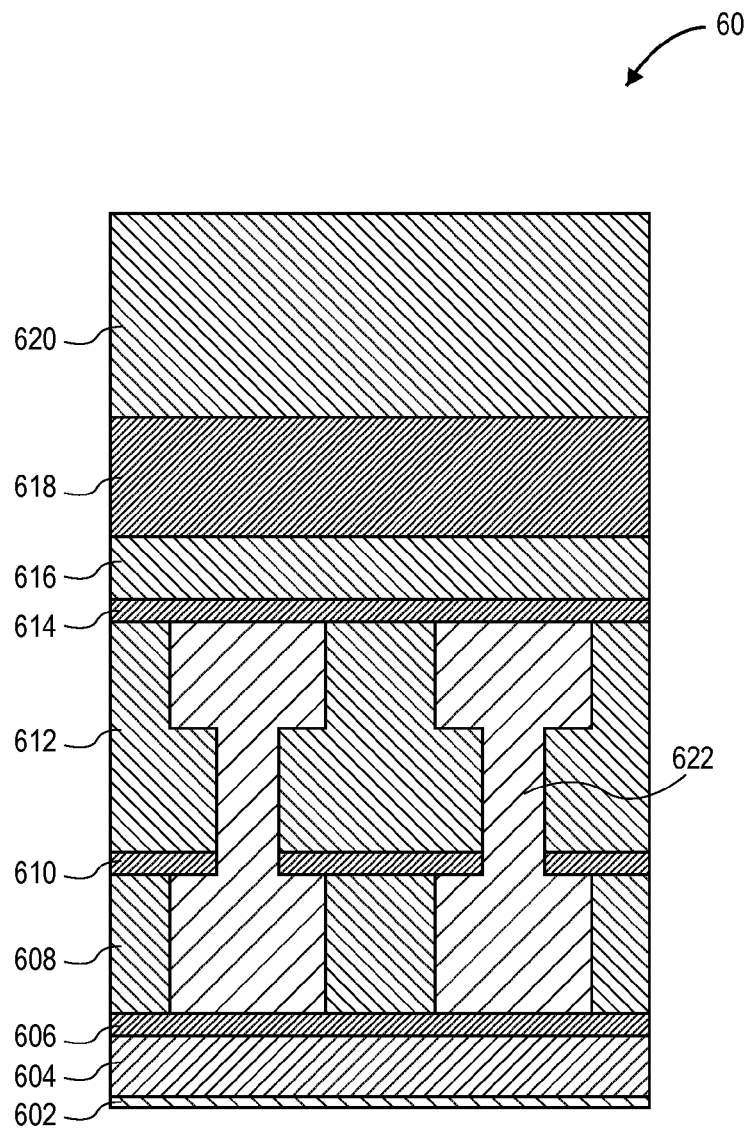
FIG. 6 illustrates a cross-sectional view of a stack of materials that may be used in a street region of a semiconductor wafer or substrate, in accordance with an embodiment of the present invention.

Referring to FIG. 6, a street region 600 includes the top portion 602 of a silicon substrate, a first silicon dioxide layer 604, a first etch stop layer 606, a first low K dielectric layer 608 (e.g., having a dielectric constant of less than the dielectric constant of 4.0 for silicon dioxide), a second etch stop layer 610, a second low K dielectric layer 612, a third etch stop layer 614, an undoped silica glass (USG) layer 616, a second silicon dioxide layer 618, and a layer of photo-resist 620, with relative thicknesses depicted. Copper metallization 622 is disposed between the first and third etch stop layers 606 and 614 and through the second etch stop layer 610. In a specific embodiment, the first, second and third etch stop layers 606, 610 and 614 are composed of silicon nitride, while low K dielectric layers 608 and 612 are composed of a carbon-doped silicon oxide material.

Figures 7, 8:
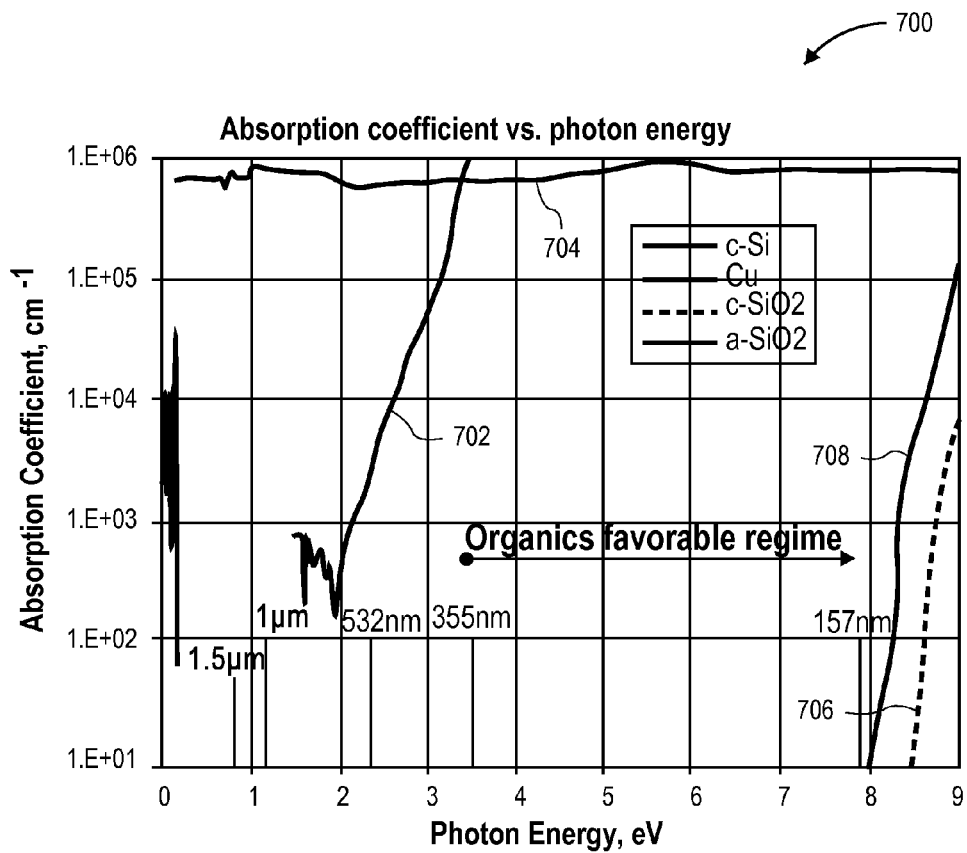
FIG. 7 includes a plot of absorption coefficient as a function of photon energy for crystalline silicon (c-Si), copper (Cu), crystalline silicon dioxide (c-SiO2), and amorphous silicon dioxide (a-SiO2), in accordance with an embodiment of the present invention.
FIG. 8 is an equation showing the relationship of laser intensity for a given laser as a function of laser pulse energy, laser pulse width, and laser beam radius.

Under conventional laser irradiation (such as nanosecond-based or picosecond-based laser irradiation), the materials of street 600 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. For example, FIG. 7 includes a plot 700 of absorption coefficient as a function of photon energy for crystalline silicon (c-Si, 702), copper (Cu, 704), crystalline silicon dioxide (c-SiO2, 706), and amorphous silicon dioxide (a-SiO2, 708), in accordance with an embodiment of the present invention. FIG. 8 is an equation 800 showing the relationship of laser intensity for a given laser as a function of laser pulse energy, laser pulse width, and laser beam radius.

Using equation 800 and the plot 700 of absorption coefficients, in an embodiment, parameters for a femtosecond laser-based process may be selected to have an essentially common ablation effect on the inorganic and organic dielectrics, metals, and semiconductors even though the general energy absorption characteristics of such materials may differ widely under certain conditions. For example, the absorptivity of silicon dioxide is non-linear and may be brought more in-line with that of organic dielectrics, semiconductors and metals under the appropriate laser ablation parameters. In one such embodiment, a high intensity and short pulse width femtosecond-based laser process is used to ablate a stack of layers including a silicon dioxide layer and one or more of an organic dielectric, a semiconductor, or a metal. In a specific embodiment, pulses of approximately less than or equal to 400 femtoseconds are used in a femtosecond-based laser irradiation process to remove a mask, a street, and a portion of a silicon substrate.

By contrast, if non-optimal laser parameters are selected, in stacked structures that involve two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns or between 10-15 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

In an embodiment, etching the semiconductor wafer 304 includes using a plasma etching process. In one embodiment, a through-silicon via type etch process is used. For example, in a specific embodiment, the etch rate of the material of semiconductor wafer 304 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 404 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In an embodiment, the mask layer 308 is removed after the singulation process, as depicted in FIG. 3C.

Accordingly, referring again to FIGS. 3A-3C, wafer dicing may be preformed by initial laser ablation through a mask layer, through wafer streets (including metallization), and partially into a silicon substrate. The laser pulse width may be selected in the femtosecond range. Die singulation may then be completed by subsequent through-silicon deep plasma etching. A specific example of a materials stack for dicing is described below in association with FIGS. 9A-9D, in accordance with an embodiment of the present invention. It is to be understood that although for illustrative purposes, one gap is shown as formed in a street between adjacent dies, in accordance with an embodiment of the present invention, a pair of parallel gaps is formed in each street.

Figure 9A:
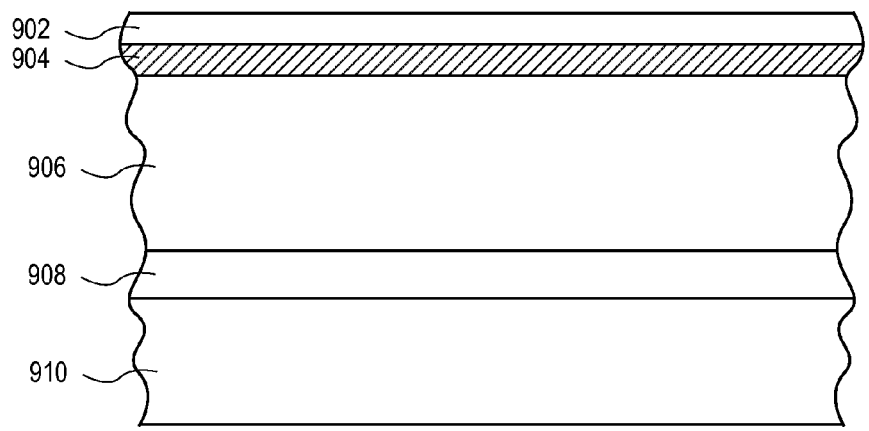
FIGS. 9A-9D illustrate cross-sectional views of various operations in a method of dicing a semiconductor wafer, in accordance with an embodiment of the present invention.

Referring to FIG. 9A, a materials stack for hybrid laser ablation and plasma etch dicing includes a mask layer 902, a device layer 904, and a substrate 906. The mask layer, device layer, and substrate are disposed above a die attach film 908 which is affixed to a backing tape 910. In an embodiment, the mask layer 902 is a photo-resist layer such as the photo-resist layers described above in association with mask 402. The device layer 904 includes an inorganic dielectric layer (such as silicon dioxide) disposed above one or more metal layers (such as copper layers) and one or more low K dielectric layers (such as carbon-doped oxide layers). The device layer 904 also includes streets arranged between integrated circuits, the streets including the same or similar layers to the integrated circuits. The substrate 906 is a bulk single-crystalline silicon substrate.

In an embodiment, the bulk single-crystalline silicon substrate 906 is thinned from the backside prior to being affixed to the die attach film 908. The thinning may be performed by a backside grind process. In one embodiment, the bulk single-crystalline silicon substrate 906 is thinned to a thickness approximately in the range of 50-100 microns. It is important to note that, in an embodiment, the thinning is performed prior to a laser ablation and plasma etch dicing process. In an embodiment, the photo-resist layer 902 has a thickness of approximately 5 microns and the device layer 904 has a thickness approximately in the range of 2-3 microns. In an embodiment, the die attach film 908 (or any suitable substitute capable of bonding a thinned or thin wafer or substrate to the backing tape 910) has a thickness of approximately 20 microns.

Figure 9B:
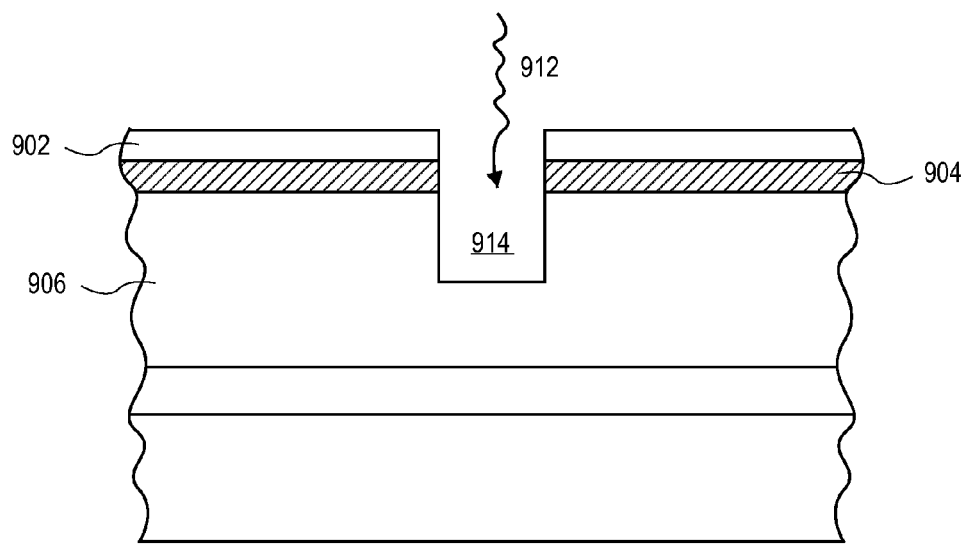
Figure 9C:
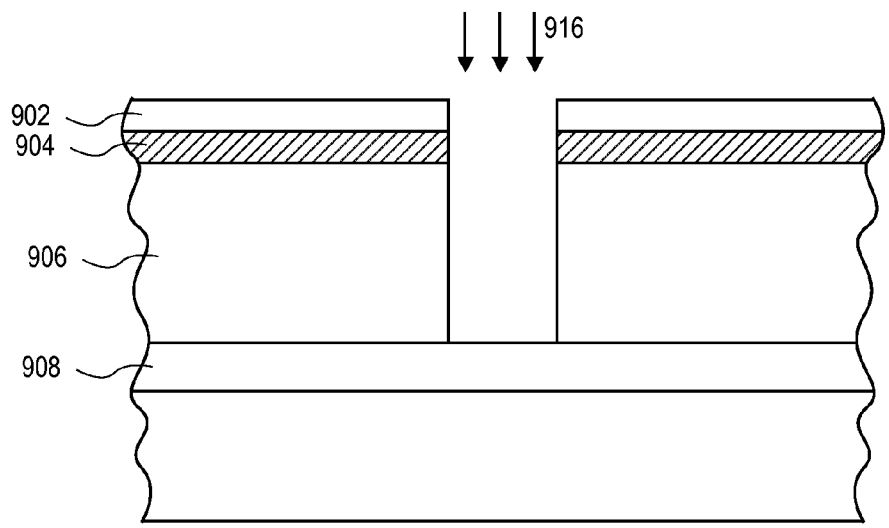

Referring to FIG. 9B, the mask 902, the device layer 904 and a portion of the substrate 906 are patterned with a femtosecond-based laser scribing process 912 to form trenches 914 in the substrate 906. Referring to FIG. 9C, a through-silicon deep plasma etch process 916 is used to extend the trench 914 down to the die attach film 908, exposing the top portion of the die attach film 908 and singulating the silicon substrate 906. The device layer 904 is protected by the photo-resist layer 902 during the through-silicon deep plasma etch process 916.

Figure 9D:
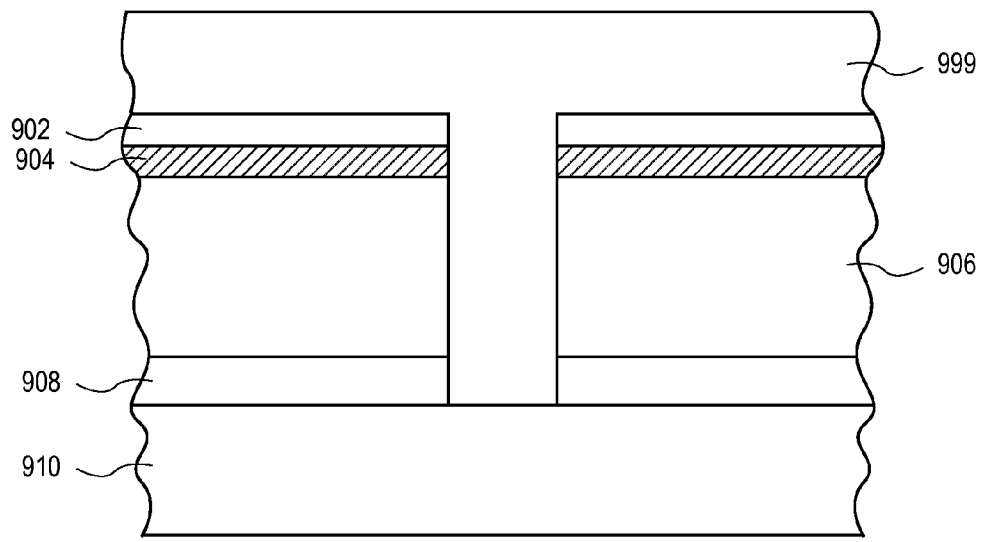

Referring to FIG. 9D, the singulation process may further include patterning the die attach film 908, exposing the top portion of the backing tape 910 and singulating the die attach film 908. In an embodiment, the die attach film is singulated by a laser process or by an etch process. Further embodiments may include subsequently removing the singulated portions of substrate 906 (e.g., as individual integrated circuits) from the backing tape 910. In one embodiment, the singulated die attach film 908 is retained on the back sides of the singulated portions of substrate 906. Other embodiments may include removing the masking photo-resist layer 902 from the device layer 904. In an alternative embodiment, in the case that substrate 906 is thinner than approximately 50 microns, the laser ablation process 912 is used to completely singulate substrate 906 without the use of an additional plasma process.

Subsequent to singulating the die attach film 908, in an embodiment, the masking photo-resist layer 902 is removed from the device layer 904. In an embodiment, the singulated integrated circuits are removed from the backing tape 910 for packaging. In one such embodiment, the patterned die attach film 908 is retained on the backside of each integrated circuit and included in the final packaging. However, in another embodiment, the patterned die attach film 908 is removed during or subsequent to the singulation process.

Figure 10:
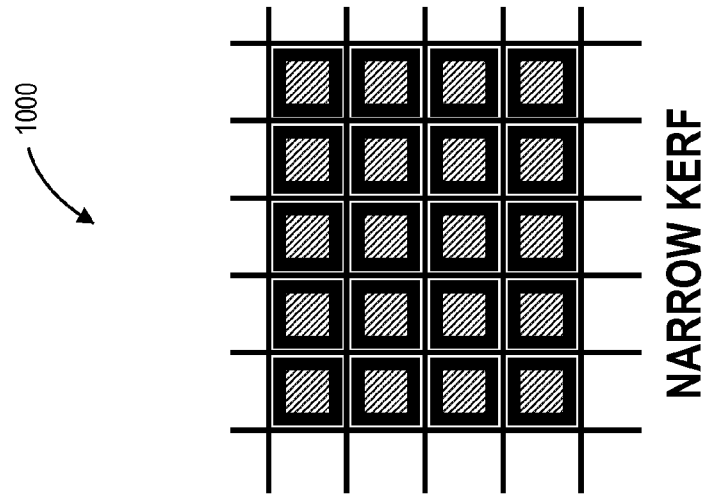
FIG. 10 illustrates a layout of dies separated by a narrow street.
Figure 11:
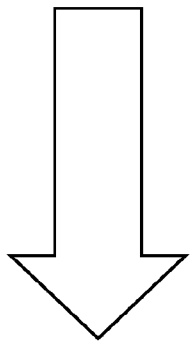
FIG. 11 illustrates a layout of dies separated by a wide street, in accordance with an embodiment of the present invention.
Figure 11:
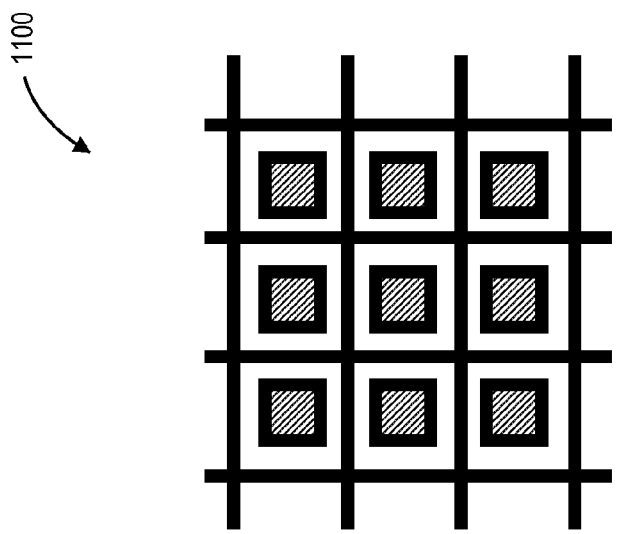

Referring again to FIG. 4B, the dies may be separated by streets having a width (W) of approximately 50 microns or greater. Such a width may be greater than a usable kerf for a laser scribing process. For example, FIG. 10 illustrates a layout 1000 of dies separated by a narrow street. The street may be scribed by using a pass of a laser having a small spot size, e.g., a narrow kerf. By contrast, FIG. 11 illustrates a layout 1100 of dies separated by a wide street, in accordance with an embodiment of the present invention. In one such embodiment, a usable spot size or laser kerf may be too narrow and, as such, two parallel gaps are formed, as described in association with FIG. 4B.

A single process tool may be configured to perform many or all of the operations in a hybrid laser ablation and plasma etch singulation process. For example, FIG. 12 illustrates a block diagram of a tool layout for laser and plasma dicing of wafers or substrates, in accordance with an embodiment of the present invention.

Figure 12:
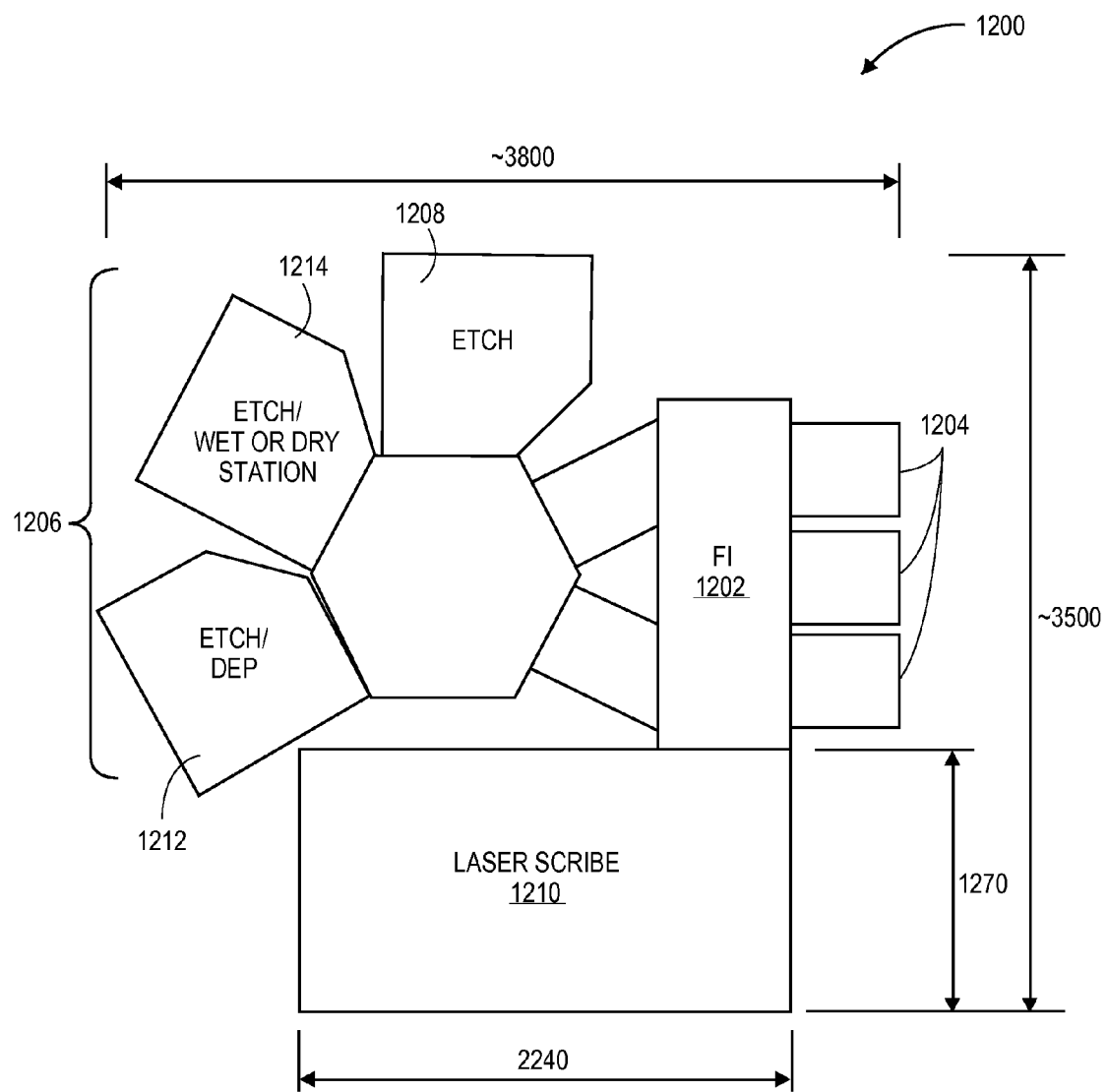
FIG. 12 illustrates a block diagram of a tool layout for laser and plasma dicing of wafers or substrates, in accordance with an embodiment of the present invention.

Referring to FIG. 12, a process tool 1200 includes a factory interface 1202 (FI) having a plurality of load locks 1204 coupled therewith. A cluster tool 1206 is coupled with the factory interface 1202. The cluster tool 1206 includes one or more plasma etch chambers, such as plasma etch chamber 1208. A laser scribe apparatus 1210 is also coupled to the factory interface 1202. The overall footprint of the process tool 1200 may be, in one embodiment, approximately 3500 millimeters (3.5 meters) by approximately 3800 millimeters (3.8 meters), as depicted in FIG. 12.

In an embodiment, the laser scribe apparatus 1210 houses a femtosecond-based laser. The femtosecond-based laser is suitable for performing a laser ablation portion of a hybrid laser and etch singulation process, such as the laser abalation processes described above. In one embodiment, a moveable stage is also included in laser scribe apparatus 1200, the moveable stage configured for moving a wafer or substrate (or a carrier thereof) relative to the femtosecond-based laser. In a specific embodiment, the femtosecond-based laser is also moveable. The overall footprint of the laser scribe apparatus 1210 may be, in one embodiment, approximately 2240 millimeters by approximately 1270 millimeters, as depicted in FIG. 12. It is to be understood, however, in other embodiments, a nano- or pico-second based laser is used.

In an embodiment, the one or more plasma etch chambers 1208 is configured for etching a wafer or substrate through the gaps in a patterned mask to singulate a plurality of integrated circuits. In one such embodiment, the one or more plasma etch chambers 1208 is configured to perform a deep silicon etch process. In a specific embodiment, the one or more plasma etch chambers 1208 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 1208 to facilitate high silicon etch rates. In an embodiment, more than one etch chamber is included in the cluster tool 1206 portion of process tool 1200 to enable high manufacturing throughput of the singulation or dicing process.

The factory interface 1202 may be a suitable atmospheric port to interface between an outside manufacturing facility with laser scribe apparatus 1210 and cluster tool 1206. The factory interface 1202 may include robots with arms or blades for transferring wafers (or carriers thereof) from storage units (such as front opening unified pods) into either cluster tool 1206 or laser scribe apparatus 1210, or both.

Cluster tool 1206 may include other chambers suitable for performing functions in a method of singulation. For example, in one embodiment, in place of an additional etch chamber, a deposition chamber 1212 is included. The deposition chamber 1212 may be configured for mask deposition on or above a device layer of a wafer or substrate prior to laser scribing of the wafer or substrate. In one such embodiment, the deposition chamber 1212 is suitable for depositing a photo-resist layer. In another embodiment, in place of an additional etch chamber, a wet/dry station 1214 is included. The wet/dry station may be suitable for cleaning residues and fragments, or for removing a mask, subsequent to a laser scribe and plasma etch singulation process of a substrate or wafer. In an embodiment, a metrology station is also included as a component of process tool 1200.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 1200 described in association with FIG. 12. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 13:
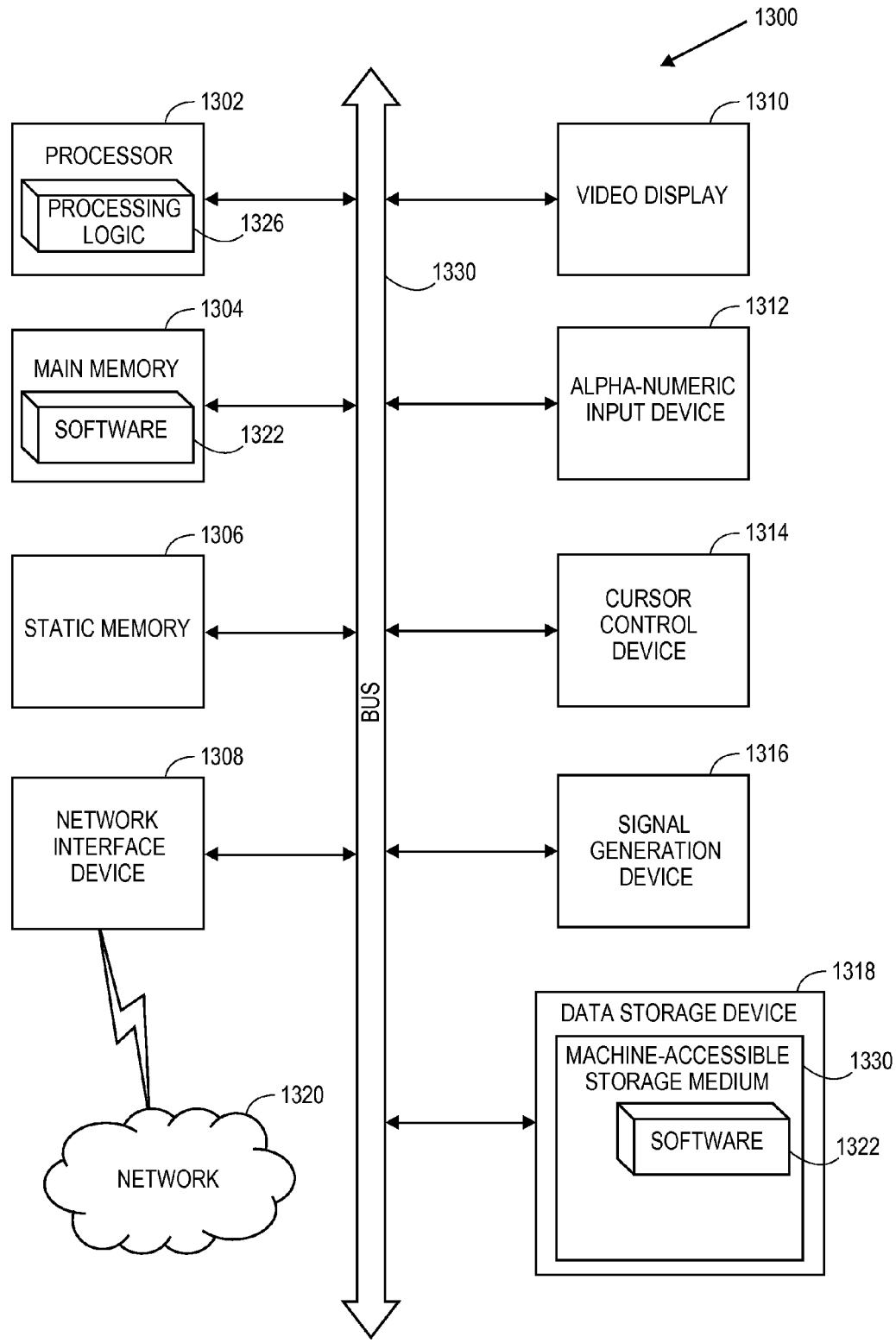
FIG. 13 illustrates a block diagram of an exemplary computer system, in accordance with an embodiment of the present invention.

FIG. 13 illustrates a diagrammatic representation of a machine in the exemplary form of a computer system 1300 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1300 includes a processor 1302, a main memory 1304 (e.g., read-only memory (ROM), flash memory, dynamic random access memory (DRAM) such as synchronous DRAM (SDRAM) or Rambus DRAM (RDRAM), etc.), a static memory 1306 (e.g., flash memory, static random access memory (SRAM), etc.), and a secondary memory 1318 (e.g., a data storage device), which communicate with each other via a bus 1330.

Processor 1302 represents one or more general-purpose processing devices such as a microprocessor, central processing unit, or the like. More particularly, the processor 1302 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1302 may also be one or more special-purpose processing devices such as an application specific integrated circuit (ASIC), a field programmable gate array (FPGA), a digital signal processor (DSP), network processor, or the like. Processor 1302 is configured to execute the processing logic 1326 for performing the operations described herein.

The computer system 1300 may further include a network interface device 1308. The computer system 1300 also may include a video display unit 1310 (e.g., a liquid crystal display (LCD), a light emitting diode display (LED), or a cathode ray tube (CRT)), an alphanumeric input device 1312 (e.g., a keyboard), a cursor control device 1314 (e.g., a mouse), and a signal generation device 1316 (e.g., a speaker).

The secondary memory 1318 may include a machine-accessible storage medium (or more specifically a computer-readable storage medium) 1331 on which is stored one or more sets of instructions (e.g., software 1322) embodying any one or more of the methodologies or functions described herein. The software 1322 may also reside, completely or at least partially, within the main memory 1304 and/or within the processor 1302 during execution thereof by the computer system 1300, the main memory 1304 and the processor 1302 also constituting machine-readable storage media. The software 1322 may further be transmitted or received over a network 1320 via the network interface device 1308.

While the machine-accessible storage medium 1331 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits separated by dicing streets. The method includes forming a mask above the semiconductor wafer, the mask including a layer covering and protecting the integrated circuits. The mask is patterned with a laser scribing process to provide a patterned mask having a pair of parallel gaps for each dicing street, exposing regions of the semiconductor wafer between the integrated circuits. Each gap of each pair of parallel gaps is separated by a distance. The semiconductor wafer is etched through the gaps in the patterned mask to singulate the integrated circuits.

Thus, methods of dicing semiconductor wafers, each wafer having a plurality of integrated circuits, have been disclosed. In accordance with an embodiment of the present invention, approaches for wafer dicing with wide kerf by using a laser scribing and plasma etching hybrid approach are described. In an embodiment, a method of dicing a semiconductor wafer having a plurality of integrated circuits separated by dicing streets involves forming a mask above the semiconductor wafer, the mask including a layer covering and protecting the integrated circuits. The mask is patterned with a laser scribing process to provide a patterned mask having a pair of parallel gaps for each dicing street, exposing regions of the semiconductor wafer between the integrated circuits. Each gap of each pair of parallel gaps is separated by a distance. The semiconductor wafer is etched through the gaps in the patterned mask to singulate the integrated circuits. In one such embodiment, a total width of the distance plus the width of each gap of each pair of parallel gaps is approximately in the range of 50-85 microns. In one such embodiment, the width of each gap of each pair of parallel gaps is approximately in the range of 10-15 microns.

What is claimed is:

1. A method of dicing a semiconductor wafer comprising a plurality of integrated circuits separated by dicing streets, the method comprising:
    forming a mask above the semiconductor wafer, the mask comprising a layer covering and protecting the integrated circuits;
    patterning the mask with a laser scribing process to provide a patterned mask having a pair of parallel gaps for each dicing street, exposing regions of the semiconductor wafer between the integrated circuits, wherein each gap of each pair of parallel gaps is separated by a distance; and
    etching the semiconductor wafer through the gaps in the patterned mask to singulate the integrated circuits.

2. The method of claim 1, wherein each gap of each pair of parallel gaps is formed at the same time using a split laser beam.

3. The method of claim 1, wherein each gap of each pair of parallel gaps is formed at the same time using a two laser beams.

4. The method of claim 1, wherein each gap of each pair of parallel gaps is formed sequentially.

5. The method of claim 1, wherein a total width of the distance plus the width of each gap of each pair of parallel gaps is approximately in the range of 50-85 microns.

6. The method of claim 1, wherein the width of each gap of each pair of parallel gaps is approximately in the range of 10-15 microns.

7. The method of claim 1, wherein etching the semiconductor wafer through the gaps in the patterned mask to singulate the integrated circuits comprises retaining portions of the semiconductor wafer between each gap of each pair of parallel gaps.

8. The method of claim 1, wherein patterning the mask with the laser scribing process comprises forming trenches in the regions of the semiconductor wafer below the gaps, and etching the semiconductor wafer comprises etching the trenches formed with the laser scribing process.

9. The method of claim 1, wherein patterning the mask with the laser scribing process comprises using a femtosecond-based laser scribing process using a laser having a wavelength of approximately less than or equal to 540 nanometers with a laser pulse width of approximately less than or equal to 400 femtoseconds.

10. The method of claim 1, wherein etching the semiconductor wafer comprises using a high density plasma etching process.

11. A method of dicing a silicon substrate comprising a plurality of integrated circuits separated by dicing streets, the method comprising:
    forming a mask above the silicon substrate, the mask comprising a layer covering and protecting the integrated circuits, the integrated circuits comprising a layer of silicon dioxide disposed above a layer of low K material and a layer of copper;
    patterning the mask with a laser scribing process to provide a patterned mask having a pair of parallel gaps for each dicing street, exposing regions of the silicon substrate between the integrated circuits, wherein each gap of each pair of parallel gaps is separated by a distance; and
    etching the silicon substrate through the gaps in the patterned mask to singulate the integrated circuits, wherein etching the silicon substrate through the gaps in the patterned mask to singulate the integrated circuits comprises retaining portions of the silicon substrate between each gap of each pair of parallel gaps.

12. The method of claim 11, wherein each gap of each pair of parallel gaps is formed at the same time using a split laser beam.

13. The method of claim 11, wherein each gap of each pair of parallel gaps is formed at the same time using a two laser beams.

14. The method of claim 11, wherein each gap of each pair of parallel gaps is formed sequentially.

15. The method of claim 11, wherein a total width of the distance plus the width of each gap of each pair of parallel gaps is approximately in the range of 50-85 microns.

16. The method of claim 11, wherein the width of each gap of each pair of parallel gaps is approximately in the range of 10-15 microns.

17. The method of claim 11, wherein patterning the mask with the laser scribing process comprises forming trenches in the regions of the silicon substrate below the gaps, and etching the silicon substrate comprises etching the trenches formed with the laser scribing process.

18. The method of claim 11, wherein etching the silicon substrate comprises using a high density plasma etching process.

* * * * *